(12) United States Patent
Matsuura

(10) Patent No.: US 7,822,392 B2
(45) Date of Patent: Oct. 26, 2010

(54) FREQUENCY MODULATION CIRCUIT, TRANSMISSION CIRCUIT AND COMMUNICATION DEVICE

(75) Inventor: Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 600 days.

(21) Appl. No.: 11/936,433

(22) Filed: Nov. 7, 2007

(65) Prior Publication Data
US 2008/0113630 A1    May 15, 2008

Related U.S. Application Data

(60) Provisional application No. 60/858,387, filed on Nov. 13, 2006.

(51) Int. Cl.
*H04B 1/66* (2006.01)
*H04B 1/04* (2006.01)

(52) U.S. Cl. .......................... 455/102; 455/42; 455/126
(58) Field of Classification Search .................... 455/23, 455/42, 61, 91, 102, 106, 107, 126, 90.2
See application file for complete search history.

(56) References Cited

U.S. PATENT DOCUMENTS

| | | | |
|---|---|---|---|
| 6,549,078 B1 * | 4/2003 | Sridharan et al. | 331/17 |
| 6,973,136 B2 * | 12/2005 | Kojima et al. | 375/261 |
| 7,120,396 B2 * | 10/2006 | Wilson | 455/108 |
| 7,199,677 B2 * | 4/2007 | Yoshikawa et al. | 332/127 |

* cited by examiner

*Primary Examiner*—Sonny Trinh
(74) *Attorney, Agent, or Firm*—Wenderoth, Lind & Ponack, L.L.P.

(57) ABSTRACT

Provided is a frequency modulation circuit for outputting a frequency-modulated signal with a high precision. A VCO 13 includes a first variable capacitor 132 having a predetermined capacitance change rate, and a second variable capacitor 133 having a greater capacitance change rate than that of the first variable capacitor 132. When the frequency modulation circuit is applied in a narrowband modulation method, a switch 15 switches a connection path of an open loop such that an input terminal and the first variable capacitor 132 are connected. On the other hand, when the frequency modulation circuit is applied in a wideband modulation method, the switch 15 switches the connection path of the open loop such that the input terminal and the second variable capacitor 133 are connected.

9 Claims, 8 Drawing Sheets

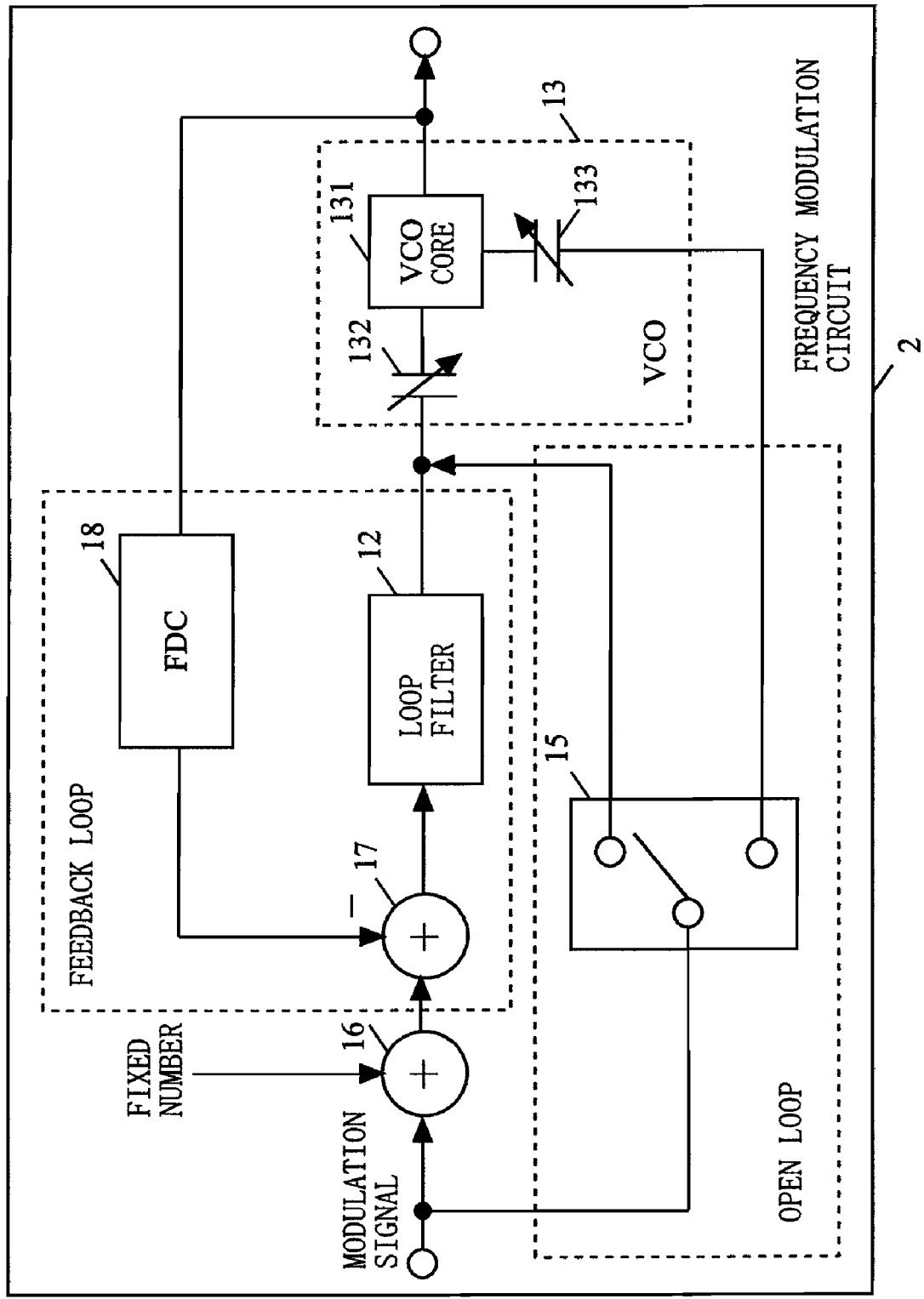
F I G. 3

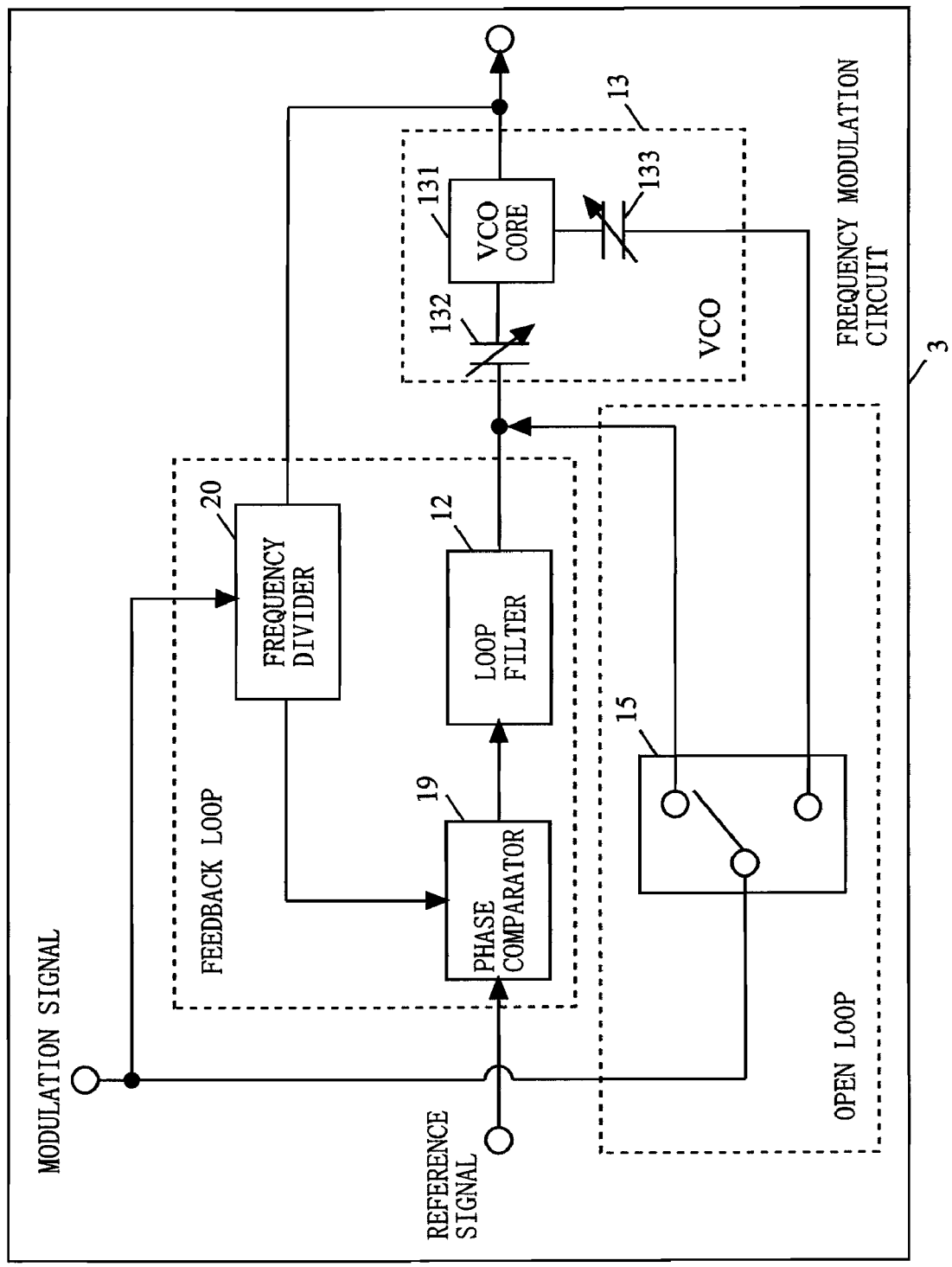
F I G. 4

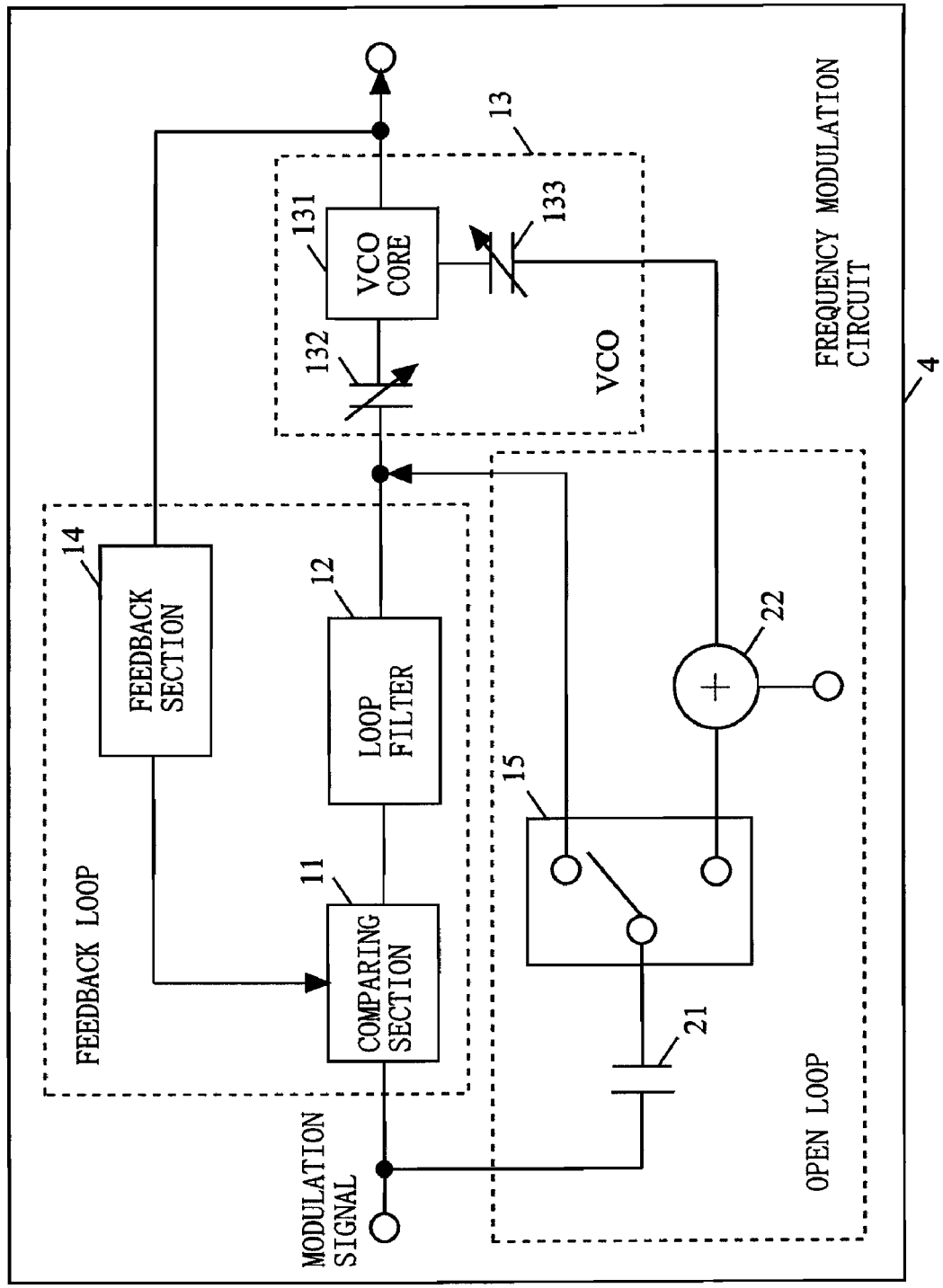
F I G. 5

FREQUENCY MODULATION CIRCUIT, TRANSMISSION CIRCUIT AND COMMUNICATION DEVICE

This is a Non-Provisional Application claiming priority to Provisional Application No. 60/858,387 filed Nov. 13, 2006.

BACKGROUND OF THE INVENTION

1. Field of the Invention

The present invention relates to: a frequency modulation circuit to be used for communication devices such as mobile phones and wireless LAN devices; a transmission circuit; and a communication device. The present invention particularly relates to: a frequency modulation circuit which is capable of outputting a frequency-modulated signal with a high precision regardless of a modulation method to be applied; a transmission circuit using the frequency modulation circuit; and a communication device using the frequency modulation circuit.

2. Description of the Background Art

Communication devices such as mobile phones and wireless LAN devices are required to secure precision of a transmission signal and operate with low power consumption. Such communication devices are required to have a frequency modulation circuit for outputting a frequency-modulated signal with a high precision and a transmission circuit using the frequency modulation circuit. Hereinafter, a conventional frequency modulation circuit will be described.

FIG. 8 is a block diagram showing an exemplary structure of a conventional frequency modulation circuit 500. As shown in FIG. 8, the conventional frequency modulation circuit 500 comprises a comparing section 501, loop filter 502, VCO (voltage-controlled oscillating circuit) 503 and a feedback section 504. The VOC 503 comprises a VOC core 5031 and a variable capacitor 5032. As an input signal, a modulation signal is inputted to the frequency modulation circuit 500 via an input terminal. In the frequency modulation circuit 500, the modulation signal, which is inputted via the input terminal, branches so as to be inputted to the VOC 503 through two paths. The modulation signal on one path is inputted to the VOC 503 via the comparing section 501 and the loop filter 502. The modulation signal on the other path is inputted to the VOC 503 directly from the input terminal.

The VOC 503 controls an oscillatory frequency thereof in accordance with the modulation signal which is inputted via the loop filter 502 or directly from the input terminal, thereby frequency-modulating the modulation signal, and then outputs a frequency-modulated signal. To be specific, the VOC 503 controls, based on the inputted modulation signal, a voltage applied to the variable capacitor 5032, thereby controlling the oscillatory frequency of the VOC core 5031.

The loop filter 502 suppresses high-frequency components of the modulation signal inputted via the comparing section 501, and outputs the modulation signal. The feedback section 504 feeds, back to the comparing section 501, the frequency-modulated signal outputted from the VOC 503. The comparing section 501 compares a frequency of the inputted modulation signal with a frequency of the frequency-modulated signal outputted from the VOC 503, and causes the frequencies to synchronize with each other, thereby stabilizing the frequency of the frequency-modulated signal outputted from the VOC 503.

The feedback section 504, comparing section 501 and loop filter 502 form a feedback loop, whereas the path connecting from the input terminal to the VOC 503 forms an open loop. Generally speaking, the frequency modulation circuit 500 realizes highly precise frequency modulation by using the feedback loop, and realizes wideband frequency modulation by using the open loop.

However, the conventional frequency modulation circuit 500 has a problem in that when the circuit 500 is applied in various modulation methods, highly precise low-noise frequency modulation is not always realized. For example, it is conceivable that the frequency modulation circuit 500 is applied in a modulation method used for a relatively narrow band, such as GMSK or EDGE (hereinafter, referred to as a narrowband modulation method), or in a modulation method used for a relatively wide band, such as UTMS (hereinafter, referred to as a wideband modulation method). For example, in the case where the frequency modulation circuit 500 is applied in a wideband modulation method, frequency modulation is required to be realized in a band which is dozens of times wider than in the case where the circuit 500 is applied in a narrowband modulation method.

To be specific, in the case where the frequency modulation circuit 500 is applied in a wideband modulation method, the modulation signal to be inputted to the variable capacitor 5032 has a far greater amplitude than in the case where the frequency modulation circuit 500 is applied in the narrowband modulation method. Since the variable capacitor 5032 is designed to accept the modulation signal having such a great amplitude, when, in the case where the frequency modulation circuit 500 is applied in a narrowband modulation method, the modulation signal having a small amplitude is inputted to the variable capacitor 5032, a signal-to-noise ratio (SN ratio) of the modulation signal significantly deteriorates due to noise influence. Thus, there is a problem that the conventional frequency modulation circuit 500 is not always able to realize highly precise low-noise frequency modulation.

SUMMARY OF THE INVENTION

Therefore, an object of the present invention is to provide: a frequency modulation circuit which is capable of outputting a low-noise frequency-modulated signal with a high precision regardless of a modulation method to be applied; a transmission circuit using the frequency modulation circuit; and a communication device using the frequency modulation circuit.

An object of the present invention is directed to a frequency modulation circuit for frequency-modulating an input signal and outputting a resultant signal. In order to achieve the above object, the frequency modulation circuit of the present invention comprises: an input terminal to which the input signal is inputted; a VCO for frequency-modulating the input signal by controlling an oscillatory frequency of the VCO in accordance with the input signal, and outputting a resultant signal as a frequency-modulated signal; a feedback loop for feeding, back to the VCO, the frequency-modulated signal outputted from the VCO; and an open loop for connecting the input terminal and the VCO. The VCO includes at least a first variable capacitor having a predetermined capacitance change rate, and a second variable capacitor having a greater capacitance change rate than that of the first variable capacitor. The open loop includes a switch for switching a connection path between the input terminal and the VCO. When the frequency modulation circuit is applied in a narrowband modulation method, the switch switches the connection path of the open loop such that the input terminal and the first variable capacitor are connected, and when the frequency modulation circuit is applied in a wideband modulation method, the switch switches the connection path of the open loop such that the input terminal and the second variable capacitor are connected.

Preferably, the feedback loop includes: a loop filter for suppressing high-frequency components of the input signal and outputting the input signal to the VCO; a feedback section for feeding back the frequency-modulated signal outputted from the VCO; and a comparing section for comparing the fed back frequency-modulated signal with the input signal, synchronizing a frequency of the input signal with a frequency of the frequency-modulated signal, and outputting the synchronized input signal to the loop filter.

The frequency modulation circuit may further comprise a first computing section, connected between the input terminal and the feedback loop, for adding or subtracting a predetermined fixed number to or from the input signal, thereby controlling a center frequency of the input signal In this case, the feedback loop includes: a loop filter for suppressing high-frequency components of the input signal and outputting the input signal to the VCO; an FDC for converting a frequency of the frequency-modulated signal, which is outputted from the VCO, to a digital value in accordance with a predetermined rule; and a second computing section for adding or subtracting the digital value, which results from conversion performed by the FDC, to or from the input signal, and outputting a resultant signal to the loop filter.

A modulation signal and a reference signal may each be inputted as the input signal. In such a case, the feedback loop includes: a loop filter for suppressing high-frequency components of the input signal, and outputting the input signal to the VCO; a frequency divider for frequency-dividing, using the modulation signal, the frequency-modulated signal outputted from the VCO, and outputting the frequency-modulated signal; and a phase comparator for comparing a phase of the reference signal with a phase of the frequency-modulated signal having been frequency-divided by the frequency divider, and outputting a phase difference therebetween to the loop filter as a difference signal.

Preferably, the open loop performs analogue signal processing on the input signal, and further includes, between the switch and the second variable capacitor, an adder for adding a predetermined DC voltage to the input signal.

Preferably, the open loop performs digital signal processing on the input signal, and further includes, between the switch and the second variable capacitor, an adder for adding a fixed number to the input signal.

The present invention is also directed to a transmission circuit for generating and outputting a transmission signal based on input data. The transmission circuit comprises: a signal generation section for generating, based on the input data, an amplitude signal and a phase signal; a regulator for outputting a signal controlled in accordance with the amplitude signal; a frequency modulation section for frequency-modulating the phase signal and outputting a resultant signal as a frequency-modulated signal; and an amplitude modulation section for amplitude-modulating the frequency-modulated signal by using the signal outputted from the regulator, and outputting a signal, which has been frequency-modulated and amplitude-modulated, as a transmission signal. The frequency modulation section is any one of the above-described frequency modulation circuits.

The present invention is also directed to a communication device comprising the above-described transmission circuit. The communication device comprises: a transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, in the frequency modulation circuit according to the present invention, the VCO includes the first variable capacitor having a low capacitance change rate and the second variable capacitor having a high capacitance change rate. When the frequency modulation circuit is applied in a narrowband modulation method, the switch switches the connection of the open loop such that the input terminal and first variable capacitor are connected. On the other hand, when the frequency modulation circuit is applied in a wideband modulation method, the switch switches the connection of the open loop such that the input terminal and second variable capacitor are connected. This allows the frequency modulation circuit to improve the SN ratio of the modulation signal inputted to the VCO and output a low-noise frequency-modulated signal with a high precision even if the frequency modulation circuit is applied in both the narrowband modulation method and wideband modulation method.

Further, since the frequency modulation section outputs the low-noise frequency-modulated signal with a high precision, the transmission circuit of the present invention is able to operate with low distortion and high efficiency. Still further, by using the above-described transmission circuit, the communication device of the present invention is able to operate with low distortion and high efficiency over a wide output power range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a block diagram showing an exemplary structure of a frequency modulation circuit 2 according to a second embodiment of the present invention;

FIG. 4 is a block diagram showing an exemplary structure of a frequency modulation circuit 3 according to a third embodiment of the present invention;

FIG. 5 is a block diagram showing an exemplary structure of a frequency modulation circuit 4 according to a fourth embodiment of the present invention;

DESCRIPTION OF THE PREFERRED EMBODIMENTS

First Embodiment

Figure 1:
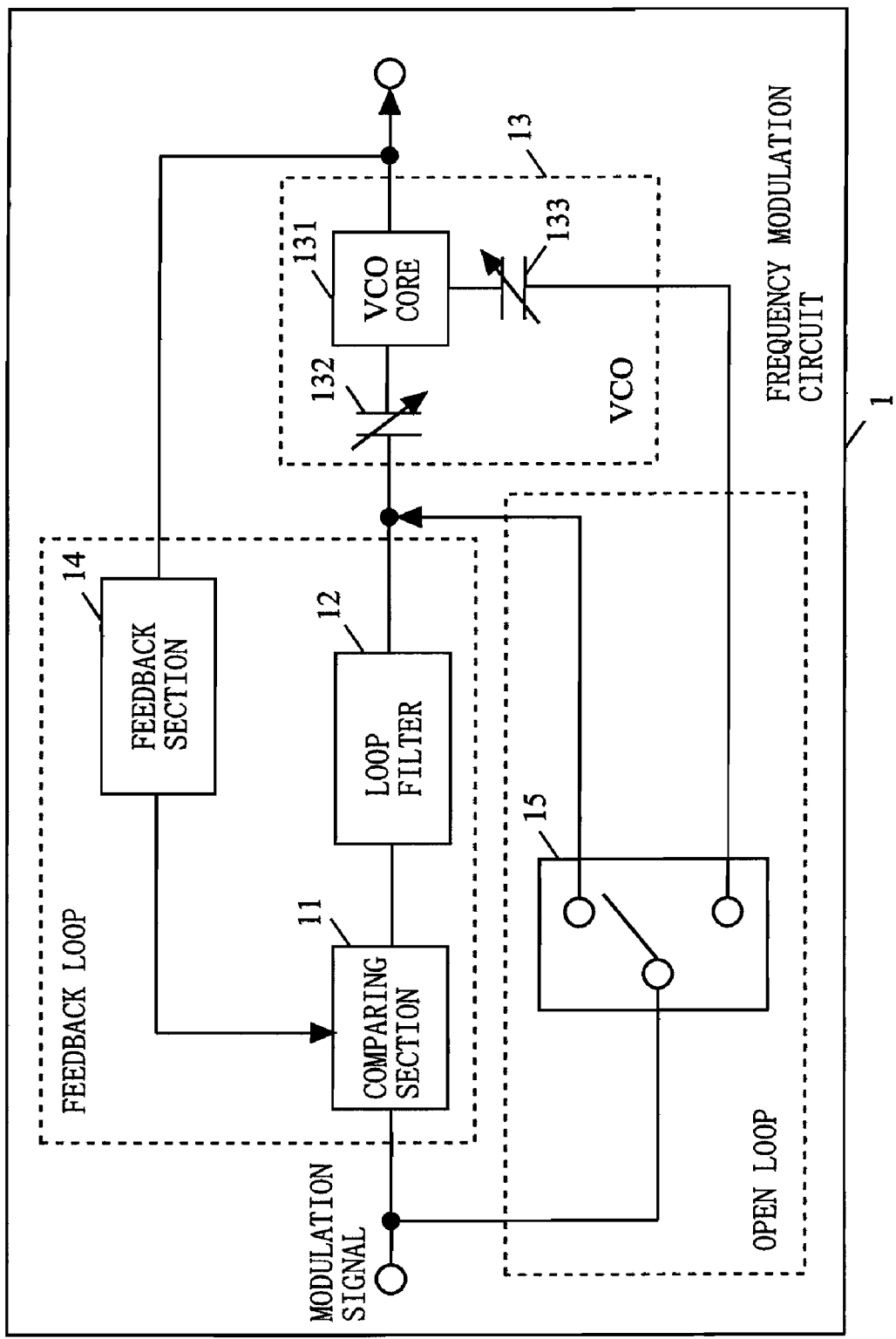
FIG. 1 is a block diagram showing an exemplary structure of a frequency modulation circuit 1 according to a first embodiment of the present invention.

FIG. 1 is a block diagram showing an exemplary structure of a frequency modulation circuit 1 according to a first embodiment of the present invention. As shown in FIG. 1, the frequency modulation circuit 1 comprises a comparing section 11, loop filter 12, VCO (voltage-controlled oscillating circuit) 13, feedback section 14 and a switch 15. The VCO 13 comprises a VCO core 131, first variable capacitor 132 and second variable capacitor 133. It is assumed here that a capacitance change rate for an input signal is greater in the second variable capacitor 133 than in the first variable capacitor 132. Note that, the structure of the VCO 13 shown in FIG. 1 is not a detailed circuit structure of the VCO 13, but a brief structure for describing features of the present invention. The detailed circuit structure of the VCO 13 will be described later in detail.

A modulation signal is inputted as an input signal to the frequency modulation circuit 1 via an input terminal. In the frequency modulation circuit 1, the modulation signal, which is inputted via the input terminal, branches so as to be inputted to the VCO 13 through two paths. The modulation signal on one path is inputted to the VOC 13 via the comparing section 11 and the loop filter 12. The modulation signal on the other path is inputted to the VOC 13 via the switch 15. The VCO 13 controls an oscillatory frequency thereof in accordance with the inputted modulation signal, thereby frequency-modulating the modulation signal to output a resultant signal as a frequency-modulated signal.

The loop filter 12 suppresses high-frequency components of the modulation signal inputted via the comparing section 11, and outputs the modulation signal. The feedback section 14 feeds, back to the comparing section 11, the frequency-modulated signal outputted from the VCO 13. The comparing section 11 compares a frequency of the inputted modulation signal with a frequency of the frequency-modulated signal outputted from the VCO 13, and causes these frequencies to synchronize with each other, thereby stabilizing the frequency of the frequency-modulated signal outputted from the VCO 13. In other words, the feedback section 14, comparing section 11 and loop filter 12 form a feedback loop, whereas the path connecting from the input terminal to the VCO 13 via the switch 15 forms an open loop.

The switch 15 switches a connection of the open loop in accordance with a modulation method in which the frequency modulation circuit 1 is applied. To be specific, when the frequency modulation circuit 1 is applied in a modulation method used for a relatively narrow band, such as GMSK or EDGE (i.e., the aforementioned narrowband modulation method), the switch 15 switches the connection of the open loop such that the input terminal and first variable capacitor 132 are connected. On the other hand, when the frequency modulation circuit 1 is applied in a modulation method used for a relatively wide band, such as UMTS (i.e., the aforementioned wideband modulation method), the switch 15 switches the connection of the open loop such that the input terminal and second variable capacitor 133 are connected. Note that, the above-mentioned modulation methods, e.g., GMSK and UMTS, are merely examples. Types of modulation method used here are not limited thereto. Also, modulation methods used here may each be categorized into a narrowband modulation method or a wideband modulation method, based on a relative comparison of bands respectively used by the modulation methods, or based on an absolute standard.

Figure 2:
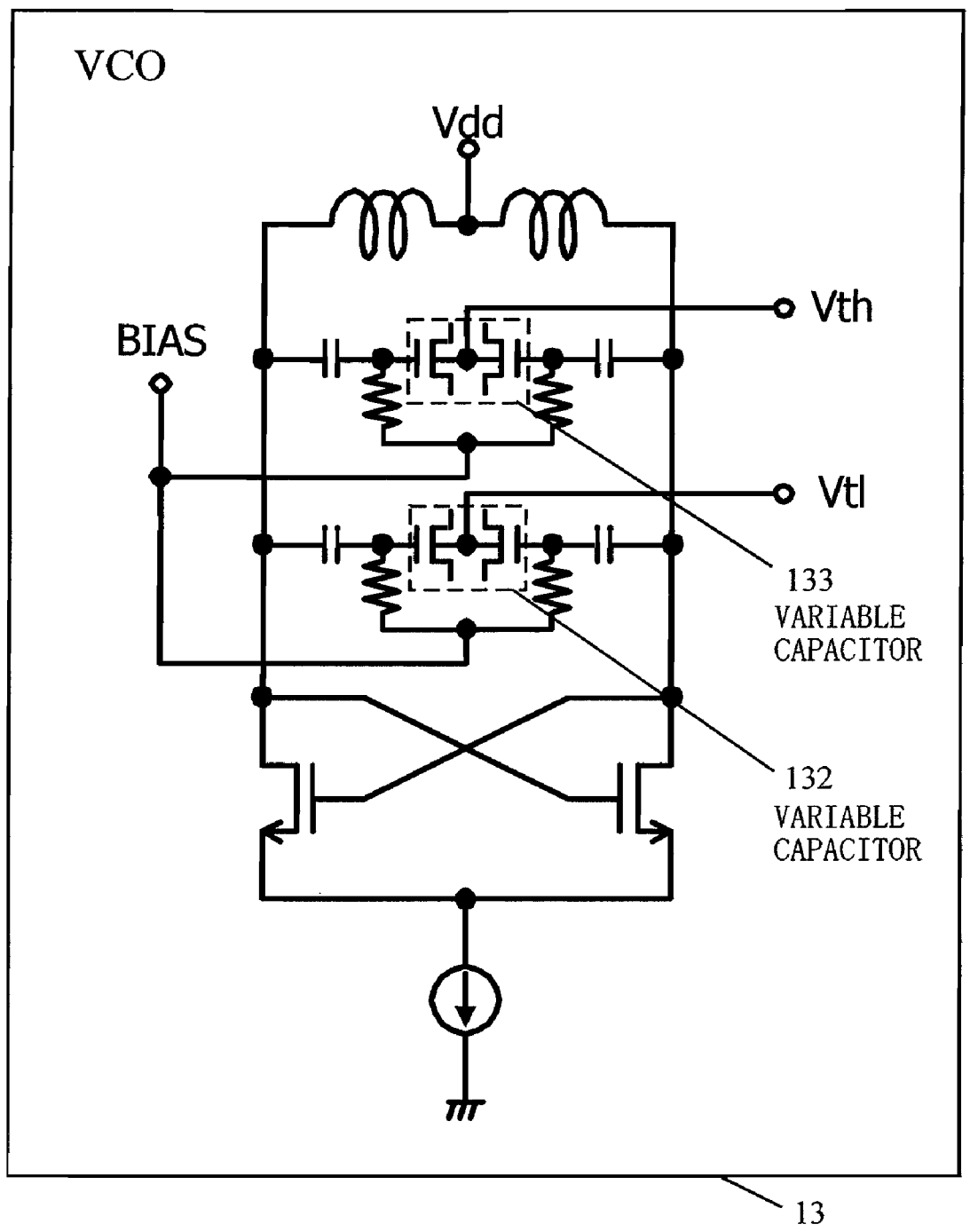
FIG. 2 shows in detail an exemplary circuit structure of a VCO 13.

FIG. 2 shows in detail an exemplary circuit structure of the VCO 13. As shown in FIG. 2, when the frequency modulation circuit 1 is applied in a narrowband modulation method, the modulation signal is inputted to a Vtl terminal via the loop filter 12 and switch 15. In other words, the modulation signal is inputted from both the feedback loop and open loop to the first variable capacitor 132 via the Vtl terminal. Since the Vth terminal is not connected to the input terminal, the modulation signal is not inputted to the Vth terminal. In other words, the modulation signal is not inputted to the second variable capacitor 133 from any of the feedback loop and open loop.

On the other hand, when the frequency modulation circuit 1 is applied in a wideband modulation method, the modulation signal is inputted to the Vtl terminal via the loop filter 12. To be specific, the modulation signal is inputted to the first variable capacitor 132 only from the feedback loop via the Vtl terminal. Also, the modulation signal is inputted to the Vth terminal via the loop filter 12 and switch 15. In other words, the modulation signal is inputted to the second variable capacitor 133 from both the feedback loop and open loop.

A BIAS terminal is supplied with a predetermined fixed voltage from a power source (not shown) regardless of a type of modulation method in which the frequency modulation circuit 1 is applied. Note that, a structure, which is a result of removing the first variable capacitor 132 and second variable capacitor 133 from the VCO 13 shown in FIG. 2, is the same as the structure of the VCO core 131 shown in FIG. 1. By having such a structure as shown in FIG. 2, the VCO 13 is able to improve the SN ratio of the modulation signal inputted to the VCO 13 even if the frequency modulation circuit 1 is applied in both the narrowband modulation method and wideband modulation method.

As described above, in the frequency modulation circuit 1 according to the first embodiment of the present invention, the VCO 13 includes the first variable capacitor 132 whose capacitance change rate is low and the second variable capacitor 133 whose capacitance change rate is high. When the frequency modulation circuit 1 is applied in a narrowband modulation method, the switch 15 switches the connection of the open loop such that the input terminal and first variable capacitor 132 are connected. When the frequency modulation circuit 1 is applied in a wideband modulation method, the switch 15 switches the connection of the open loop such that the input terminal and second variable capacitor 133 are connected. This allows the frequency modulation circuit 1 to improve the SN ratio of the modulation signal inputted to the VCO 13, and output a low-noise frequency-modulated signal with a high precision even if the frequency modulation circuit 1 is applied in both the narrowband modulation method and wideband modulation method.

Second Embodiment

FIG. 3 is a block diagram showing an exemplary structure of a frequency modulation circuit 2 according to a second embodiment of the present invention. In FIG. 3, the frequency modulation circuit 2 includes a first computing unit 16, a second computing unit 17, the loop filter 12, the VCO 13, an FDC (frequency digital converter) 18 and the switch 15. Here, the same components as those described in the first embodiment will be denoted by the same reference numerals as those used in the first embodiment, and descriptions thereof will be omitted.

The modulation signal is inputted to the first computing unit 16 via the input terminal. The first computing unit 16 adds or subtracts a predetermined fixed number to or from the inputted modulation signal, thereby controlling a center frequency of the modulation signal. In accordance with a predetermined rule, the FDC 18 converts, to a digital value, a frequency of the frequency-modulated signal outputted from the VCO 13, and outputs the digital value, which has resulted from the conversion, to the second computing unit 17. The second computing unit 17 adds or subtracts the digital value, which is outputted from the FDC 18, to or from the modulation signal inputted via the first computing unit 16, thereby stabilizing the frequency of the frequency-modulated signal outputted from the VCO 13. In other words, the FDC 18, second computing unit 17 and loop filter 12 form a feedback loop.

As described above, similarly to the first embodiment, the frequency modulation circuit 2 according to the second embodiment of the present invention is able to improve the SN ratio of the modulation signal inputted to the VCO 13, and output a low-noise frequency-modulated signal with a high precision even if the frequency modulation circuit 2 is applied in both the narrowband modulation method and wideband modulation method. Further, since the first computing unit 16 controls the center frequency of the inputted modulation signal, the frequency modulation circuit 2 is able to change the center frequency of the frequency-modulated signal outputted from the VCO 13.

Third Embodiment

FIG. 4 is a block diagram showing an exemplary structure of a frequency modulation circuit 3 according to a third embodiment of the present invention. In FIG. 4, the frequency modulation circuit 3 comprises a phase comparator 19, the loop filter 12, the VCO 13, a frequency divider 20 and the switch 15. Note that, the same components as those described in the first embodiment will be denoted by the same reference numerals as those used in the first embodiment, and descriptions thereof will be omitted.

The modulation signal and a reference signal are inputted to the frequency modulation circuit 3 via two input terminals. In the frequency modulation circuit 3, the inputted modulation signal is inputted to the frequency divider 20 and switch 15. The frequency divider 20 frequency-divides the frequency-modulated signal outputted from the VCO 13, by using the inputted modulation signal, and then outputs the frequency-modulated signal. The phase comparator 19 compares a phase of the inputted reference signal with a phase of the frequency-modulated signal inputted via the frequency divider 20, and outputs a difference between these phases to the loop filter 12 as a difference signal. Here, the frequency divider 20, phase comparator 19 and loop filter 12 form a feedback loop.

As described above, similarly to the first embodiment, the frequency modulation circuit 3 according to the third embodiment of the present invention is able to improve the SN ratio of the modulation signal inputted to the VCO 13, and output a low-noise frequency-modulated signal with a high precision even if the frequency modulation circuit 3 is applied in both the narrowband modulation method and wideband modulation method. Also, the frequency modulation circuit 3 is able to change the center frequency of the frequency-modulated signal outputted from the VCO 13, by controlling, using the feedback loop, the oscillatory frequency of the VCO 13.

Fourth Embodiment

FIG. 5 is a block diagram showing an exemplary structure of a frequency modulation circuit 4 according to a fourth embodiment of the present invention. As shown in FIG. 5, the frequency modulation circuit 4 is different from the frequency modulation circuit 1 according to the first embodiment in that the frequency modulation circuit 4 further comprises a capacitor 21 between the input terminal and switch 15, and an adder 22 between the switch 15 and second variable capacitor 133. The capacitor 21, switch 15 and adder 22 form an open loop.

The capacitor 21 removes DC components from the inputted modulation signal. The adder 22 is supplied with a DC voltage from a power supply terminal. When, in the case where the frequency modulation circuit 4 is applied in a wideband modulation method, the input terminal and second variable capacitor 133 are connected, the adder 22 adds the modulation signal, which is inputted from the input terminal, to the supplied DC voltage, and outputs a resultant signal to the VCO 13. In other words, the signal resulting from adding the modulation signal to the DC voltage is inputted to the second variable capacitor 133. When, in the case where the frequency modulation circuit 4 is applied in a narrowband modulation method, the input terminal and second variable capacitor 133 are not connected, the adder 22 outputs the DC voltage to the VCO 13. In other words, the second variable capacitor 133 is supplied with the DC voltage. Thus, even when the modulation method is switched, the center frequency of the voltage supplied to the second variable capacitor 133 does not change. For this reason, the frequency modulation circuit 4 is able to stabilize the frequency-modulated signal outputted from the VCO 13.

Although the above description gives an exemplary case where the open loop performs analogue signal processing on the input signal, the open loop may perform digital signal processing on the input signal. When the open loop performs digital signal processing on the input signal, a fixed number is inputted to the adder 22. The open loop may perform analogue signal processing or digital signal processing to remove DC components contained in the modulation signal. In such a case, the capacitor 21 is no longer necessary.

Fifth Embodiment

Figure 6:
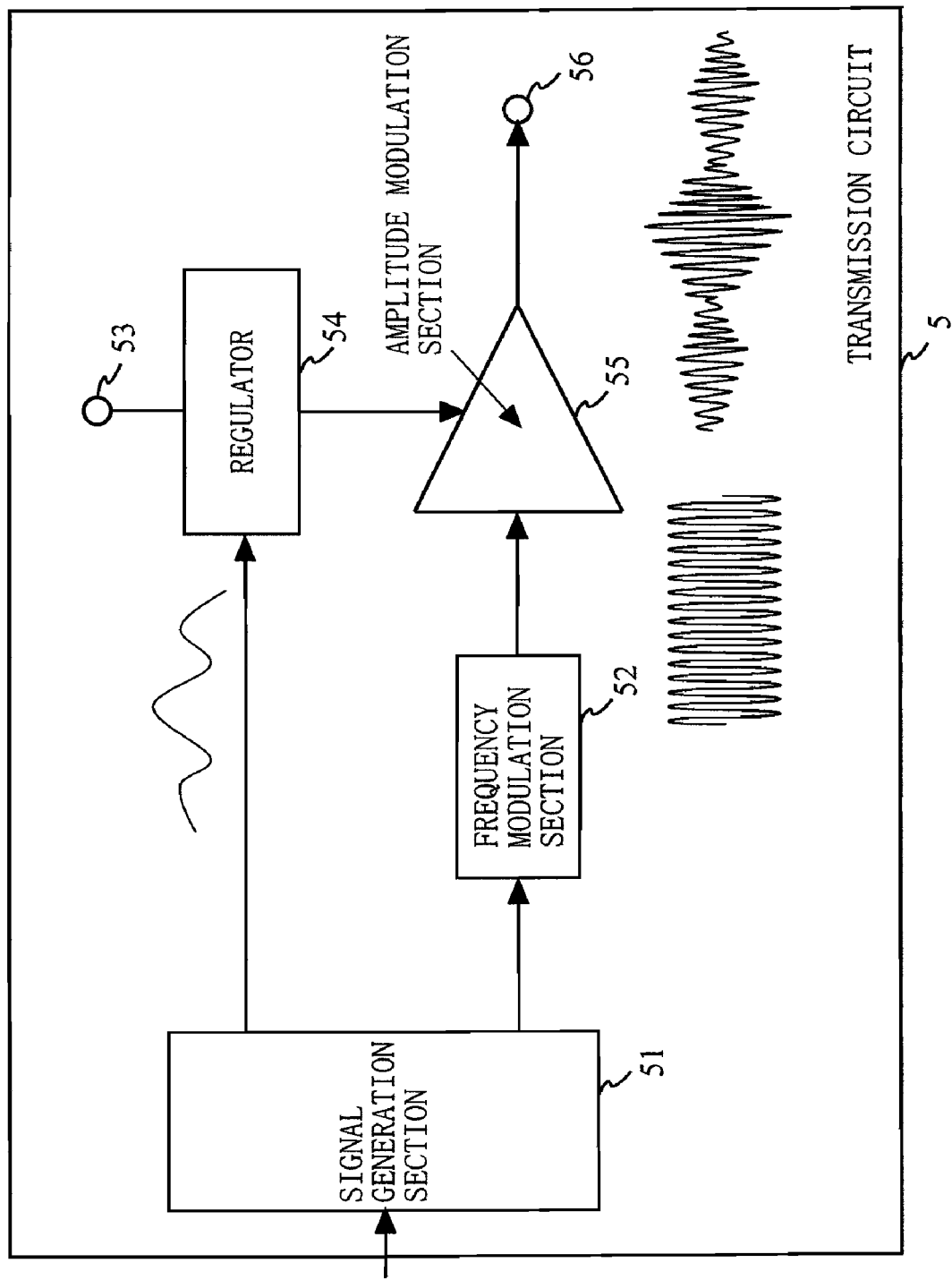
FIG. 6 is a block diagram showing an exemplary structure of a transmission circuit 5 according to a fifth embodiment of the present invention.

FIG. 6 is a block diagram showing an exemplary structure of a transmission circuit 5 according to a fifth embodiment of the present invention. In FIG. 6, the transmission circuit 5 comprises a signal generation section 51, frequency modulation section 52, power supply terminal 53, regulator 54, amplitude modulation section 55 and an output terminal 56. Here, any of the frequency modulation circuits described in the above first to fourth embodiments is used as the frequency modulation section 52.

The signal generation section 51 generates an amplitude signal and a phase signal from an input signal. The amplitude signal is inputted to the regulator 54. The regulator 54 is supplied with a DC voltage from the power supply terminal 53. The regulator 54 supplies the amplitude modulation section 55 with a voltage controlled in accordance with the inputted amplitude signal. Here, the regulator 54 may be a current-driven regulator. The phase signal is inputted to the frequency modulation section 52. The frequency modulation section 52 frequency-modulates the inputted phase signal, and outputs a frequency-modulated signal. The frequency-modulated signal is inputted to the amplitude modulation section 55. The amplitude modulation section 55 amplitude-modulates the frequency-modulated signal by using a signal supplied from the regulator 54, and outputs a resultant signal as a modulation signal having been frequency-modulated and amplitude-modulated. The modulation signal is outputted from the output terminal 56 as a transmission signal. The transmission circuit 5 operating in this manner is referred to as a polar modulation circuit.

Since the frequency modulation section 52 is capable of outputting a low-noise frequency-modulated signal with a high precision, the transmission circuit 5 is able to operate with low distortion and high efficiency.

Sixth Embodiment

Figure 7:
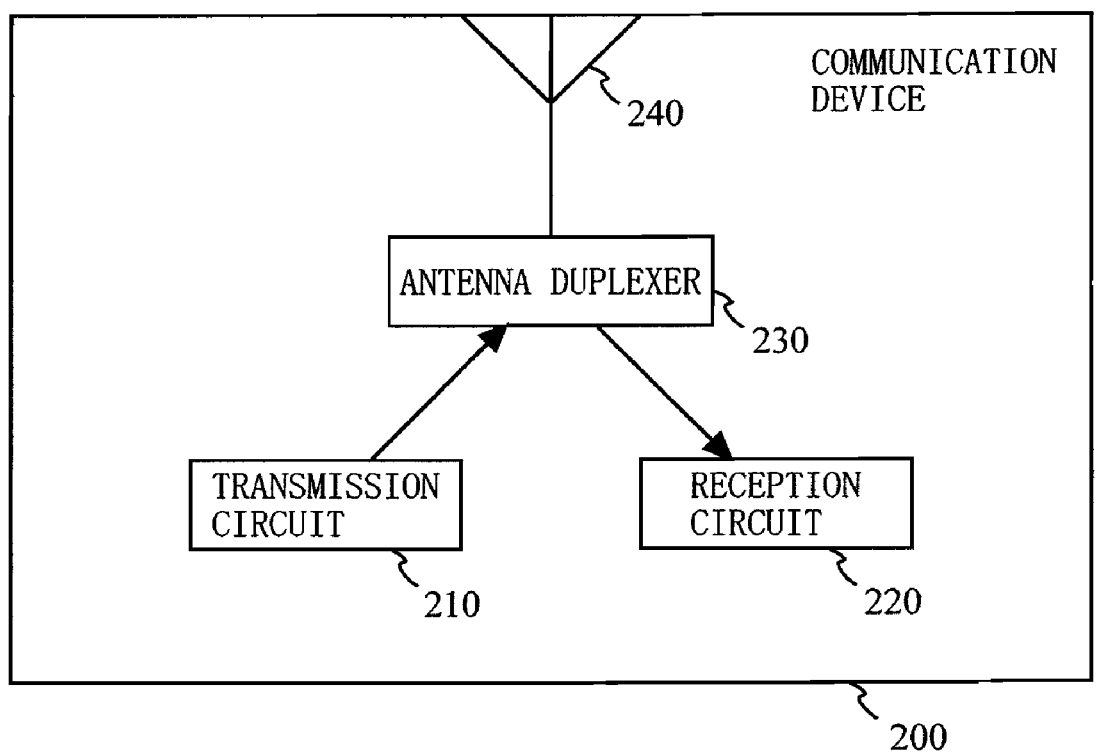
FIG. 7 is a block diagram showing an exemplary structure of a communication device 200 according to a sixth embodiment of the present invention.
Figure 8:
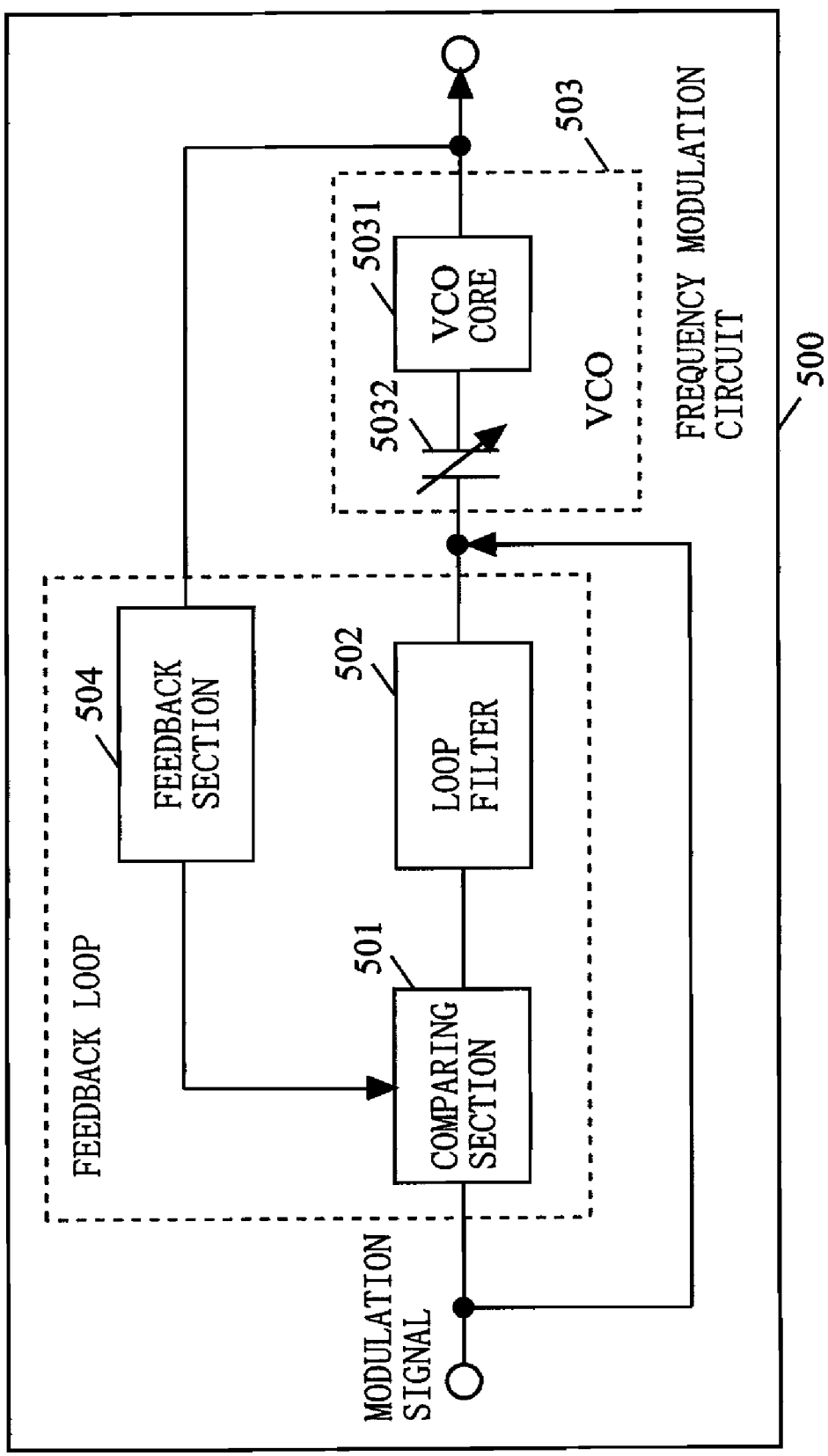
FIG. 8 is a block diagram showing an exemplary structure of a conventional frequency modulation circuit 500.

FIG. 7 is a block diagram showing an exemplary structure of a communication device 200 according to a sixth embodiment of the present invention. As shown in FIG. 7, the communication device 200 according to the sixth embodiment comprises a transmission circuit 210, reception circuit 220, antenna duplexer 230 and an antenna 240. The transmission circuit described in the above fifth embodiment is used as the transmission circuit 210. The antenna duplexer 230 transmits to the antenna 240 a transmission signal outputted from the transmission circuit 210, and prevents the transmission signal from leaking to the reception circuit 220. Also, the antenna duplexer 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer 230. The reception signal is received by the antenna 240, and then received by the reception circuit 220 via the antenna duplexer 230. The communication device 200 according to the sixth embodiment uses the transmission circuit according to the fifth embodiment, thereby securing linearity of the transmission signal and also realizing low distortion as a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a structure which includes only the transmission circuit 210 and antenna 240.

The frequency modulation circuits according to the present invention are usable for, e.g., a transmission circuit included in communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A frequency modulation circuit for frequency-modulating an input signal and outputting a resultant signal, the frequency modulation circuit comprising:
   an input terminal to which the input signal is inputted;
   a VCO for frequency-modulating the input signal by controlling an oscillatory frequency of the VCO in accordance with the input signal, and outputting a resultant signal as a frequency-modulated signal;
   a feedback loop for feeding, back to the VCO, the frequency-modulated signal outputted from the VCO; and
   an open loop for connecting the input terminal and the VCO, wherein
   the VCO includes at least a first variable capacitor having a predetermined capacitance change rate, and a second variable capacitor having a greater capacitance change rate than that of the first variable capacitor,
   the open loop includes a switch for switching a connection path between the input terminal and the VCO, and when the frequency modulation circuit is applied in a narrowband modulation method, the switch switches the connection path of the open loop such that the input terminal and the first variable capacitor are connected, and when the frequency modulation circuit is applied in a wideband modulation method, the switch switches the connection path of the open loop such that the input terminal and the second variable capacitor are connected.

2. The frequency modulation circuit according to claim 1, wherein
   the feedback loop includes:
      a loop filter for suppressing high-frequency components of the input signal and outputting the input signal to the VCO;
      a feedback section for feeding back the frequency-modulated signal outputted from the VCO; and
      a comparing section for comparing the fed back frequency-modulated signal with the input signal, synchronizing a frequency of the input signal with a frequency of the frequency-modulated signal, and outputting the synchronized input signal to the loop filter.

3. The frequency modulation circuit according to claim 1, further comprising a first computing section, connected between the input terminal and the feedback loop, for adding or subtracting a predetermined fixed number to or from the input signal, thereby controlling a center frequency of the input signal, wherein
   the feedback loop includes:
      a loop filter for suppressing high-frequency components of the input signal and outputting the input signal to the VCO;
      an FDC for converting a frequency of the frequency-modulated signal, which is outputted from the VCO, to a digital value in accordance with a predetermined rule; and
      a second computing section for adding or subtracting the digital value, which results from conversion performed by the FDC, to or from the input signal, and outputting a resultant signal to the loop filter.

4. The frequency modulation circuit according to claim 1, wherein
   a modulation signal and a reference signal are each inputted as the input signal, and
   the feedback loop includes:
      a loop filter for suppressing high-frequency components of the input signal, and outputting the input signal to the VCO;
      a frequency divider for frequency-dividing, using the modulation signal, the frequency-modulated signal outputted from the VCO, and outputting the frequency-modulated signal; and
      a phase comparator for comparing a phase of the reference signal with a phase of the frequency-modulated signal having been frequency-divided by the frequency divider, and outputting a phase difference therebetween to the loop filter as a difference signal.

5. The frequency modulation circuit according to claim 1, wherein
   the open loop:
      performs analogue signal processing on the input signal; and
      further includes, between the switch and the second variable capacitor, an adder for adding a predetermined DC voltage to the input signal.

6. The frequency modulation circuit according to claim 1, wherein
the open loop:
performs digital signal processing on the input signal; and
further includes, between the switch and the second variable capacitor, an adder for adding a fixed number to the input signal.

7. A transmission circuit for generating and outputting a transmission signal based on input data, the transmission circuit comprising:
a signal generation section for generating, based on the input data, an amplitude signal and a phase signal;
a regulator for outputting a signal controlled in accordance with the amplitude signal;
a frequency modulation section for frequency-modulating the phase signal and outputting a resultant signal as a frequency-modulated signal; and
an amplitude modulation section for amplitude-modulating the frequency-modulated signal by using the signal outputted from the regulator, and outputting a resultant signal, which has been frequency-modulated and amplitude-modulated, as a transmission signal, wherein
the frequency modulation section is the frequency modulation circuit according to claim 1.

8. A communication device comprising:
a transmission circuit for generating a transmission signal; and
an antenna for outputting the transmission signal generated by the transmission circuit, wherein
the transmission circuit is the transmission circuit according to claim 7.

9. The communication device according to claim 8, further comprising:
a reception circuit for processing a reception signal received from the antenna; and
an antenna duplexer for outputting the transmission signal generated by the transmission circuit to the antenna, and outputting the reception signal received from the antenna to the reception circuit.

* * * * *